US012573988B2

(12) United States Patent (10) Patent No.: US 12,573,988 B2
Chini et al. (45) Date of Patent: Mar. 10, 2026

(54) POWER SPECTRAL SHAPING FOR IN-BAND EMISSION CONTROL

(71) Applicant: AVAGO TECHNOLOGIES INTERNATIONAL SALES PTE. LIMITED, Singapore (SG)

(72) Inventors: Ahmad Chini, Mission Viejo, CA (US); Peiqing Wang, Laguna Beach, CA (US); Mehmet Vakif Tazebay, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 787 days.

(21) Appl. No.: 17/717,025

(22) Filed: Apr. 8, 2022

(65) Prior Publication Data

US 2022/0329220 A1 Oct. 13, 2022

Related U.S. Application Data

(60) Provisional application No. 63/173,311, filed on Apr. 9, 2021.

(51) Int. Cl.
*H03F 3/24* (2006.01)
*H03F 3/217* (2006.01)
(52) U.S. Cl.
CPC ........... *H03F 3/245* (2013.01); *H03F 3/2178* (2013.01); *H03F 2200/165* (2013.01); *H03F 2200/451* (2013.01)
(58) Field of Classification Search
CPC .. H03F 3/245; H03F 3/2178; H03F 2200/165; H03F 2200/451; H04L 25/0288;
(Continued)

(56) References Cited

U.S. PATENT DOCUMENTS

2004/0005015 A1* 1/2004 Chan ................... H04L 25/0286
375/295
2006/0018388 A1 1/2006 Chan

OTHER PUBLICATIONS

Extended European Search Report from European Patent Application No. 21181786.1, dated Dec. 14, 2021, 8 pages.

* cited by examiner

*Primary Examiner* — Andrea Lindgren Baltzell
*Assistant Examiner* — Jose E Pinero
(74) *Attorney, Agent, or Firm* — Foley & Lardner LLP

(57) ABSTRACT

It is described a transmitter device (100) and a method for transmitting an analog signal (251, 261) via an electric cable (192). The transmitter device (100) comprises (a) a signal generation circuit (210) for generating a digital transmit signal (211) comprising a sequence of transmit symbols; (b) a filter circuit (230) for spectrally shaping the generated digital transmit signal (211, 221) and for outputting a filtered digital transmit signal (231); (c) a switching unit (240) comprising (c1) a first input terminal (242) for receiving the filtered digital transmit signal (231), (c2) a second input terminal (244) for receiving another digital transmit signal (297), (c3) an output terminal (246) for outputting a digital transmit output signal (241), wherein the digital transmit output signal (241) is based on, depending on a switching state of the switching unit (240), the filtered digital transmit signal (231) or the another digital transmit signal (297), and (c4) a control terminal (248) for receiving a control signal (285) from a control circuit (280), the control signal (285) being indicative for the switching state. The transmitter device (100) further comprises the control circuit (280); and a digital to analog converter (250) for receiving the digital transmit output signal (241) and for converting the received digital transmit output signal (241) to the analog signal (251, 261).

20 Claims, 4 Drawing Sheets

194

(58) Field of Classification Search

CPC ............... H04L 25/03828; H04B 1/04; H04B
2001/0408; H04B 2001/0416

USPC ........................................................ 330/302

See application file for complete search history.

POWER SPECTRAL SHAPING FOR IN-BAND EMISSION CONTROL

CROSS-REFERENCE TO RELATED APPLICATIONS

This application claims benefit of U.S. Provisional Application No. 63/173,311, filed on Apr. 9, 2021, and European Application No. 21181786.1, filed on Jun. 25, 2021, the entirety of each of which is incorporated herein by reference for all purposes.

TECHNICAL FIELD

The present disclosure relates to a transmitter circuit being configured for performing a spectral shaping of radio frequency signals and to a transceiver system comprising such a transmitter circuit. Further, the present disclosure relates to a method for performing a spectral shaping of radio frequency signals to be transmitted.

ART BACKGROUND

Automotive vehicles incorporate a large number of electronic circuits. Not only because of the increasing demand for automotive vehicles having the functionality of autonomous driving, it is expected that the trend towards more and more electronic circuits in automotive vehicles will continue. Specifically, this trend is expected to continue because automotive vehicles incorporate and interoperate with a variety of electronic devices. For example, automotive vehicles incorporate increasing numbers of electronic devices (i) for the operation of the automotive vehicle itself as well as (ii) for interoperating with other electronic devices that support e. g. mobile communications, entertainment and navigations systems, security systems, or the like.

Every operating electronic device and in particular an electronic device operating with Radio Frequency (RF) signals contributes to a typically unwanted emission of electromagnetic radiation not only within but also outside from the automotive vehicle. In this context it is clear that any unchecked electromagnetic emission generated by an electronic device within an automotive vehicle can negatively impact the operation of other electronic devices within an automotive vehicle and/or roadside equipment being external from the automotive vehicle.

One particularly serious problem of automotive vehicles are unwanted RF emissions within a frequency range being used for Digital Audio Broadcasting (DAB) operating between 174 MHz and 239 MHz and/or frequency modulated (FM) radio systems such as metric wave systems operating between about 65 MHz and 108 MHz.

A potential source of unwanted RF emissions are tethered communication signals between communication devices, which communication signals are based on the Ethernet standard as specified in IEEE 802.3 and are transferred via a twisted pair cable. This problem of a reduced electromagnetic capability (EMC) is especially serious when Unshielded Twisted Pair (UTP) cables are used, which compared to Shielded Twisted Pair (STP) cables are often preferred because STP have a higher weight and an increased aging.

There may be a need for improving the EMC for a transmitter circuit feeding RF signals into an UTP cable.

SUMMARY

This need may be met by the subject matter according to the independent claims. Advantageous embodiments of the present disclosure are described by the dependent claims.

According to a first aspect there is provided a transmitter device for transmitting an analog signal via an electric cable. The provided transmitter device comprises (a) a signal generation circuit for generating a digital transmit signal comprising a sequence of transmit symbols; (b) a filter circuit for (filtering and) spectrally shaping the generated digital transmit signal and for outputting a filtered digital transmit signal; (c) a switching unit (MUX) comprising (c1) a first input terminal for receiving the filtered digital transmit signal, (c2) a second input terminal for receiving another digital transmit signal, and (c3) an output terminal for outputting a digital transmit output signal. The digital transmit output signal is based on, depending on a switching state of the switching unit, (i) the filtered digital transmit signal or (ii) the another digital transmit signal. The provided transmitter device further comprises (d) a control terminal for receiving a control signal from a control circuit, the control signal being indicative for the switching state; (e) the control circuit; and (f) a digital to analog converter (DAC) unit for receiving the digital transmit output signal and for converting the received digital transmit output signal to the analog signal (to be transmitted).

The described transmitter device is based on the idea that by selectively utilizing the filter circuit for generating the analog signal for the electric cable a selective spectral shaping can be realized, if desired. In this document (selective) spectral shaping is also referred to as Power Spectral Density (PSD) shaping. In accordance with the well-known behaviour of (digital) filter circuits, this spectral shaping results from the filter characteristic respectively from the frequency dependent transfer function of the filter circuit. The frequency dependent transfer function depends on the configuration or the actual (parameter or coefficient) setting of the utilized filter circuit.

By selecting a proper switching state of the switching unit, the spectral composition or the spectral distribution of the analog output signal, which is provided by the described DAC, can be adjusted towards a desired characteristic behaviour.

Thereby, a (desired) target spectral distribution, which is based on the current spectral shaping characteristics, can be generated in an easy and effective manner.

The spectral shaping based on the characteristic of the described (digital) filter circuit processing and outputting a digital signal may provide, compared to a spectral shaping with analog filter circuits, at least one of the following advantages:

(a) Because the coefficients of a digital filter are always precisely defined, it can be used to achieve a much more complex and selectively designed spectral shape of the digital output signal. This may allow for an application specific and precisely defined spectral shaping.

(b) The generated filtered digital transmit signal can be provided with a small passband ripple, a fast transition, and a high and well-defined stopband attenuation.

(c) The filter coefficients can be (dynamically) adjusted which allows the utilization of the described transmitter device for a variety of different target spectral distributions.

It is mentioned that the preceding disclosure and following discussion often utilizes the terms "circuit" or "unit" to describe a module that performs a certain function. It must be recognized that any one of such modules may be implemented in hardware, software or a combination thereof. It must also be noted that various portions of modules may be shared. For example, a first module and a second module may share various hardware components and/or software routines. Accordingly, the scope of various aspects of the present invention should not be limited by a particular module implementation or by arbitrary hardware and/or software boundaries between modules.

The described transmitter device may provide a long-lasting solution for a precise and reliable emission control. In preferred embodiments, a digital filter circuit characteristic is used which reduces the power of emissions in a frequency range or a frequency band which is assigned to a Frequency Modulation (FM) broadcasting and/or a Digital Audio Broadcasting (DAB). This can be of particular benefit for automotive applications, wherein (e. g. due to cost and weight reasons) Unshielded Twisted Pair (UTP) cables are preferably used for an intra automotive wired network. Thereby, despite of the increased electromagnetic pollution produced by UTP cables as compared to Shielded Twisted Pair (STP) cables a substantial interference-free reception of FM and/or DAB signals may be possible. In some embodiments the frequency band, which is predominately attenuated with the described filter circuit, is the range below approximately 200 MHz.

The described transmitter device may provide the advantage that a potentially necessary or beneficial pre-equalization of (frequency) channels can be realized in an effective manner. An appropriately tailored pre-equalization may make a significant contribution for allowing a receiver device to capture the transmitted analog signal having a comparatively low signal magnitude.

According to an embodiment, by controlling the switching state, the control circuit is configured to define at least two operational states of the entire transmitter device. Thereby, in a first operational state the functionality provided by the filter circuit is utilized (enabled) and in the second operational state the functionality of the filter circuit is not utilized (disabled). This may allow for an easy and/or for a fast functional reconfiguration of the described transmitter device. In preferred embodiments, the switching state control is realized by means of appropriately set register bits within the control circuit, which is operating on the physical layer of the well-known Open Systems Interconnection model (OSI model).

According to a further embodiment one of the two operational states is a wakeup operational state or a linkup operational state.

Performing the described functional reconfiguration specifically for a wakeup process may allow to optimize the operation of the described transmitter device for a process which during a long lasing operation of the transmitter circuit may be carried out frequently in particular for reducing the overall energy consumption. Hence, when the wakeup process and optionally also a corresponding "going into a sleep mode" process can be accomplished in an effective and reliable manner, it might be possible to change this operational state comparatively often in order to make a significant contribution to an excellent energy management.

Performing the described operational reconfiguration specifically for a linkup process may have the advantage that (also) this type of process can be accomplished in an effective and reliable manner. In this context the term "linkup process" may comprise a standardized negotiation procedure in order to set up a communication link between the described transmitter circuit and a (cable connected) receiver circuit. The described standard may be for instance the IEEE 802.3 standard.

According to a further embodiment the transmitter device further comprises an up-sampling circuit being connected between the signal generation circuit and the filter circuit for up-sampling the digital transmit signal being generated by the signal generation circuit to an up-sampled transmit signal being received by the filter circuit with a predefined up-sampling factor. This means that the filter circuit receives and processed an up-sampled digital signal.

In other words, during operation of the described receiver circuit the filter circuit operates as an oversampled filter. This may have the effect that a significantly different attenuation factor can be achieved for the PSD shaping below and above the respective Nyquist frequency. Specifically, the described transmitter device may be configured to perform a PSD shaping wherein the signal strength within a lower frequency band provided by the signal generation circuit is reduced while an upper frequency band is not or only very weakly attenuated.

According to a further embodiment the transmitter device further comprises a clock circuit (i) for timing the operation of the signal generation circuit with a first clock signal and (ii) for timing the operation of the up-sampling circuit with a second clock signal. Thereby, a first clock rate of the first clock signal is different from a second clock rate of the second clock signal.

The multi clock circuit may be realized with a single electric circuit or with two subcircuits each being responsible for generating one of the two clock signal.

The described multi clock circuit, i.e. a circuit configured for providing more than one clock signal, may provide the advantage that the operation of the signal generation circuit and the operation of the up-sampling circuit can be synchronized in a simple and effective manner. A synchronized operation typically results in a precisely up-sampled signal having an accurate desired waveform with no or only negligible artefacts.

According to a further embodiment the clock circuit is electrically connected with at least one of (a) the filter circuit for timing the operation of the filter circuit with the second clock signal and (b) the DAC for timing the operation of the DAC with the second clock signal. This may provide the advantage that also the other components of the described transmitter device, which components need a timing respectively a clocking, can be operationally driven by the multi clock circuit.

According to a further embodiment the second dock rate is an integer multiple of the first clock rate and the integer multiple defines the up-sampling factor. This may provide the advantage that the multi clock circuit can be realized with a simple digital circuitry for instance by utilizing common multiplier and/or divider units.

In some embodiments the integer multiple is the same as the up-sampling factor. The integer multiple and/or the up-sampling factor may be in the range between two (2) and eight (8). Preferably the integer multiple and/or the up-sampling factor is a power of two. In some embodiments the integer multiple and/or the up-sampling factor is four (4).

A possible first clock rate may be in the range between 250 MHz and 2 GHz, preferably between 500 MHz and 1 GHz. In some embodiments the first clock rate is approximately 750 MHz. With an up-sampling factor of four (4) the second clock rate would be 3 GHz.

According to a further embodiment the filter circuit comprises Finite Impulse Response filter. This may provide the advantage that also the filter circuit may be realized with simple and commonly available and hence cheap electronic components.

Further, the utilization of a Finite Impulse Response (FIR) filter may provide the described transmitter device with a high stability. Unwanted artificial internal oscillations can be effectively avoided because an FIR filter typically operates without any feedback loop.

According to a further embodiment the control circuit is connected with the filter circuit. Further, the control circuit is configured for controlling a transfer function of the filter circuit. This may allow to dynamically adapt the transfer function of the filter circuit. Since the chosen transfer function is directly associated with the spectral filter characteristic and, as a consequence, also with the spectral density of the analog output signal of the described transmitter device, the PSD shaping can be easily adapted to possibly changing electromagnetic requirements of the environment of the transmitter device and/or of the electric cable along its entire length. Also the transfer function control may be realized by means of appropriately set register bits within the control circuit, which also in this respect is operating on the physical layer of the OSI model.

According to a further embodiment the transmitter device further comprises an amplifier circuit, which is connected with an output terminal of the DAC and which is configured for converting the analog signal into an amplified analog signal.

The described amplifier may be any suitable (analog) circuit having a gain factor of more than one. However, in some embodiments the gain factor of the amplifier circuit may also be smaller than one (1) in particular in a certain frequency range. However, the amplifier circuit has preferably a flat spectral behavior which provides an at least approximately same gain factor for the entire frequency spectrum. In case there is a non-negligible frequency dependency of the gain factor, this frequency dependency can be taken into account respectively can be compensated by the frequency dependency respectively the transfer function of the filter circuit.

The amplifier circuit may not only increase the voltage of the output signal. Preferably, the amplifier circuit generates a power amplification. In this case the amplifier circuit may be denominated a line driver.

According to a further embodiment the control circuit is connected with the amplifier circuit and is configured for controlling a gain factor of the amplifier circuit. This may allow to dynamically adapt, depending on actual requirements, the output level respectively the strength of the amplified analog signal. Also the gain factor control may be realized by means of appropriately set register bits within the control circuit, which also in this respect is operating on the physical layer of the OSI model.

According to a further aspect there is provided a communication system comprising (a) a transmitter device as described above; (b) a receiver device; and (c) a communication cable communicatively coupling the transmitter device with the receiver device.

According to an embodiment the communication cable is an Unshielded Twisted Pair (UTP) cable.

As has already been described above, the described PSD shaping of the transmitter device is configured for selectively attenuating the electromagnetic signals within a certain frequency range. Hence, by adapting this frequency range with external devices which have a high potential of being negatively affected specifically within this frequency range, an electromagnetic shielding provided in Shielded Twisted Pair (STP) cables, can be omitted without (significantly) disturbing the operation of such devices.

Compared to STP cables UTP cables are not only cheap but also have a smaller weight. Further, they can be bended with smaller bending radii without being damage. Hence, the described communication system with the UTP cable can be used in an advantageous manner e.g. in automotive applications.

According to a further aspect there is provided a method for transmitting an analog signal via an electric cable in particular by means of a transmitter device as described above. The provided method comprises (a) generating a digital transmit signal comprising a sequence of transmit symbols; (b) spectrally shaping the generated digital transmit signal into a filtered digital transmit signal; (c) receiving the filtered digital transmit signal at a first input terminal of a switching unit which additionally comprises a second input terminal for receiving, another digital transmit signal; (d) outputting a digital transmit output signal at an output terminal of the switching unit, wherein the digital transmit output signal is based on the filtered digital transmit signal; and (e) converting the digital transmit output signal to the analog signal; and (f) transmitting the analog signal.

It has to be noted that embodiments of the invention have been described with reference to different subject matters. In particular, some embodiments have been described with reference to a method type claim whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claim and features of the apparatus type claims, is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

BRIEF DESCRIPTION OF THE DRAWING

FIG. 2 shows a detailed block diagram of the transmitter device of FIG. 1.

FIG. 2 shows a detailed block diagram of the transmitter device of FIG. 1.

DETAILED DESCRIPTION

Figure 1:
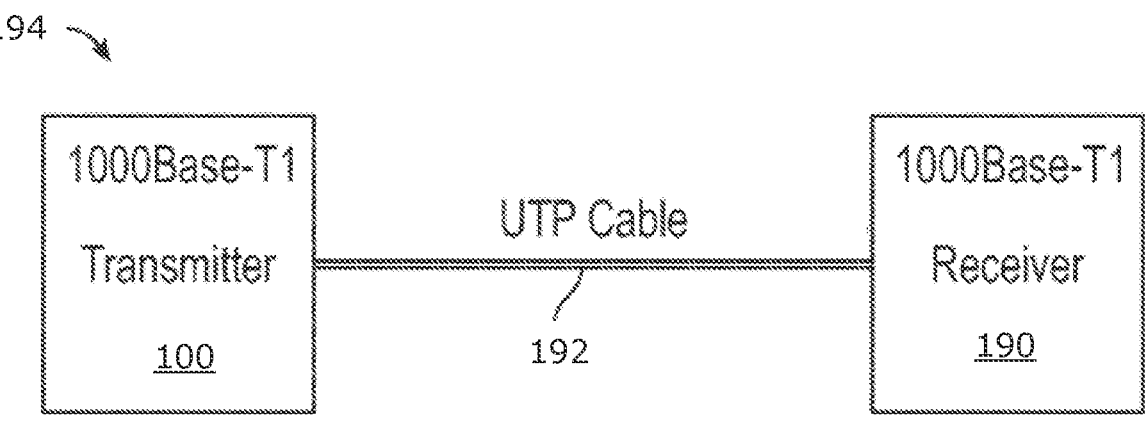
FIG. 1 shows a communication system with a transmitter device.

The illustration in the drawing is schematic. It is noted that in different figures, similar or identical elements or features are provided with the same reference signs or with reference signs, which are different from the corresponding reference signs only within the first digit. In order to avoid unnecessary repetitions elements or features, which have already been elucidated with respect to a previously described embodiment, are not elucidated again at a later position of the description.

FIG. 1 shows in a high-level block diagram a communication system 194 with a transmitter device 100. According to the exemplary embodiment described here the communication system 194 is installed in an automotive environment. The transmitter device 100 is communicatively connected with a receiver device 190 being also a component of the communication system 194 via an Unshielded Twisted Pair (UTP) data communication cable 192. The transmitter device 100 is configured for transmitting signals at an adjustable power level, which can be controlled by a number of register bits or via a transmit level control signal receivable from a not depicted control circuit, e.g. a so called physical layer (PHY) control and management module.

According to the exemplary embodiment described here both the transmitter device 100 and the receiver device 190 are physical layer (PHY) devices, for example, a well-known 1000BASE-T1 Ethernet PHY transceiver module which can be obtained from various semiconductor companies In-car testing of this transceiver module in accordance with the IEEE P802.3bp standard (i.e., clause 97) over type A UTP cables suggests very strict electromagnetic emission requirements which exceed the provisions of the international special committee on radio interference (CISPR) 25 Class 5. Without meeting such strict electromagnetic emission requirements external devices such as e. g. a Digital Audio Broadcasting (DAB) receiver and/or a frequency modulated (FM) radio receiver will suffer from electromagnetic interference. The solution of the subject technology provides a Power Spectral Density (PSD) shaping of an analog transmit signal which can be fed into the UTP cable without producing a strong electromagnetic pollution in predefined spectral bandwidths.

Figure 2:
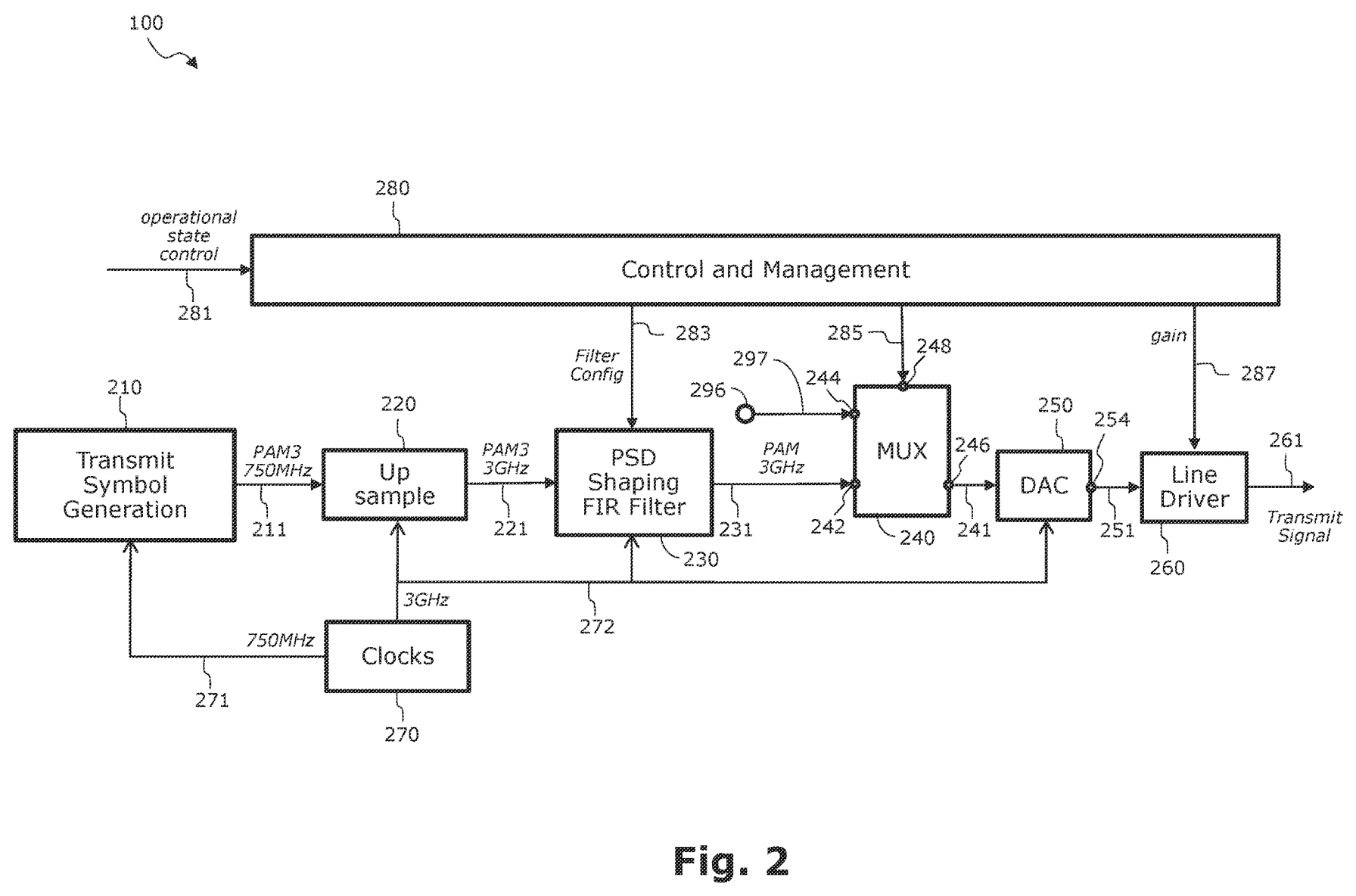

FIG. 2 shows a block diagram of the transmitter device 100 of FIG. 1. The transmitter device 100 comprises a signal generation circuit 210, which is considered as a communication source. This communication source generates a sequence of transmit symbols of a digital transmit signal 211. The signal generation circuit 210 may be a 1000BASE-T1 Ethernet PHY transceiver module being widely used for Ethernet automotive applications. According to the embodiment described here the digital transmit signal 211 is a logical level three (3) Pulse Amplitude Modulation (PAM) signal with a frequency of 750 MHz. This means that every singly pulse carried three pieces of information, e.g. "0", "1", and "2". In other embodiments the logical level of the PAM transmit signal 211 may be higher, e. g. five (5). The operation of the signal generation circuit 210 is docked with a clock circuit 270, which provides a first clock signal 271 to the signal generation circuit 210. This first clock signal 271 has a frequency of also 750 MHz.

The digital transmit signal 211 is forwarded to an up-sampling circuit 220, which converts this signal to an up-sampled transmit signal 221. The up-sampled transmit signal 221 is also a three logical level PAM signal. According to the exemplary embodiment described here the up-sampling factor is four (4). This results in a frequency of 3 GHz for the up-sampled transmit signal 221. The operation of the up-sampling circuit 220 is driven by a second clock signal 272, which is also generated by the clock circuit 270. This second clock signal 272 has a frequency of 3 GHz, which corresponds to the frequency of the up-sampled PAM signal 221.

As can be taken from FIG. 2, the up-sampled PAM transmit signal 221 is forwarded to a filter circuit 230. According to the embodiment described here the filter circuit 230 is a (digital) Finite Impulse Response (FIR) filter. In accordance with basic principles of filtering (digital)

signals the filter circuit 230 has a transfer function, which causes a spectral shaping. This spectral shaping, which in this document is called Power Spectral Density (PSD) shaping, has the effect that the spectral intensity distribution of a filtered signal 231 being provided at an output of the filter circuit 230 is different than the spectral intensity distribution of the incoming up-sampled PAM signal 221. Specifically, the spectral characteristic of the filter circuit 230 is defined by its transfer function. Depending on the transfer function the amplitude of the filtered signal 231 for a certain frequency band is attenuated by a higher attenuation factor that the signal amplitude in other frequency bands. According to the embodiment described here the transfer function is selected such that the amplitude of the filtered signal 231 for signal components corresponding to frequencies below 200 MHz at the output of the entire transmitter device 100 is strongly reduced. Hence, the electromagnetic pollution cause by the transmitter device 100 within this frequency band will be reduced and external Radio Frequency (RF) devices such as Frequency Modulation (FM) receiver and/or a Digital Audio Broadcasting (DAB) receiver, which are typically highly sensitive in this frequency band, can operated with no or with only neglectable interference.

The concrete shape of the transfer function is defined by filter parameters respectively filter coefficients. According to the embodiment described here these filter parameters can be dynamically adjusted via a filter configuration signal 283, which is provided by the PHY layer control circuit 280. The filter parameters can be represented by the setting of certain register bits of the control circuit 280. Since the filter parameters provided via the filter configuration signal 283 have a strong influence on the characteristic of the entire transmitter device 100, the control circuit 280 is denominated and depicted in FIG. 2 as a "Control and Management" module. As can be taken from FIG. 2, the control circuit 280 receives an external control signal 282 from a not depicted external superordinate higher layer control device.

According to the exemplary embodiment described here also the filter circuit 230 is clocked by the second clock signal 272 having a frequency of 3 GHz.

It is mentioned that also the filtered signal 231 is a PAM signal. In this embodiment the logical level of the PAM signal 231 is at least three (3). Preferably, this logical level is higher than the logical level of the PAM signal 221.

As can be further taken from FIG. 2, the transmitter device 100 further comprises a switching unit 240. According to the exemplary embodiment described here the switching unit 240 is realized by a simple multiplexing (MUX) unit. The switching unit 240 comprises (a) a first input terminal 242 for receiving the filtered PAM signal 221, (b) a second input terminal 244 for receiving another digital signal 297, (c) an output terminal 246, and (d) a control terminal 248.

The switching unit 240 "decides" whether the PAM signal 231 can be further processed. Specifically, depending on the switching state of the switching unit 240 either (i) the incoming filtered PAM signal 221 is forwarded and presented at the output terminal 246 or (ii) another digital signal 297, which is generated by any other external symbol source 296, is forwarded and presented at the output terminal 246. This means that the switching state of the switching unit 240 defines the operational state of the entire transmitter device 100. Of course, when the switching unit 240 forwards the other digital signal 297 it is not necessary, however not forbidden, to operate any one above elucidated components "signal generation circuit 210", "up-sampling circuit 220", and "filter circuit 230".

The switching state of the switching circuit 140 can be controlled by means of a switching control signal 285, which, according to the embodiment described here, is also provided by the PHY layer control circuit 280. In other words, the switching control signal 285 is "responsible" whether the FIT filter circuit 230 is (i) active respectively enabled or (ii) not active respectively disabled.

According to the exemplary embodiment described here the FIR filter circuit 230 is enabled when the signal generation circuit 210 transmits the so called Send-T, Send-I or Send-N messages as defined by the standard IEEE 802.3 clause 97. The FIR filter circuit 230 is also enabled in some test modes according to IEEE 802.3 clause 97 for measurements such as measurements in a PSD test mode.

According to the exemplary embodiment described here the filter circuit 230 is disabled (or reconfigured) when transmitting the so called Send-S message as also defined by the standard IEEE 802.3 clause 97. Further, filter circuit 230 is disabled for (a) an auto negotiation or link up procedure with a receiver (see IEEE 802.3 clause 98), (b) a Send-WUP (Wake Up Pulse as defined by Open alliance TC10) and/or (c) other operation modes as defined e.g. by the standard IEEE 802.3 clause 96.

As can be taken from FIG. 2, the signal provided at the output terminal 246, which in this document is denominated selected digital signal 241, is forwarded to a digital to analog converter (DAC) 250. The DAC 250 converts the selected digital signal 241 into an analog transmit output signal 251, which is provided at an output terminal 254 of the DAC 250.

According to the exemplary embodiment described here the analog transmit output signal 251 is forwarded to an amplifier circuit 260. The amplifier circuit 260, which may also be denominated a line driver, provides the final analog output signal of the transmitter device 100. In this document this final analog output signal is denominated amplified transmit signal 261.

Figure 3:
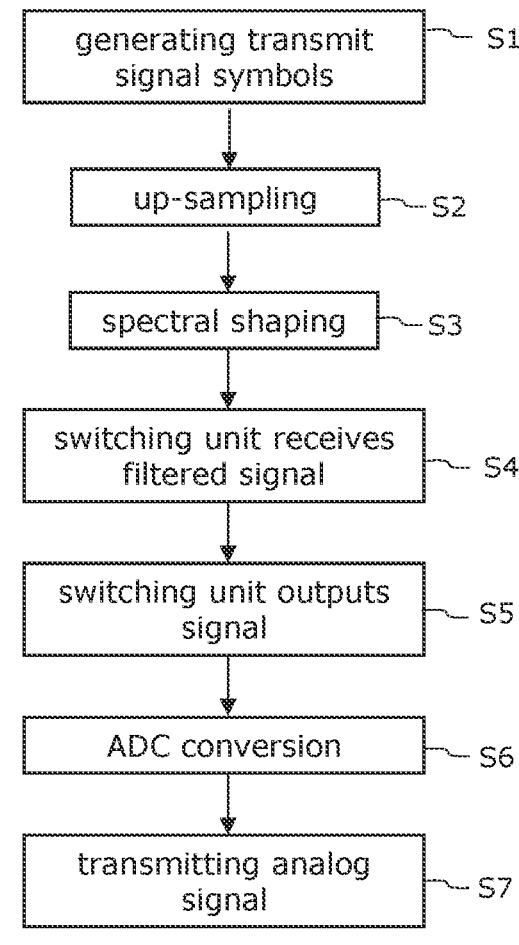
FIG. 3 shows a flow chart of a method for transmitting PSD shaped signals into a communication cable.

As can be taken from FIG. 2, also the amplifier circuit 260 is communicatively coupled with the control circuit 280. Specifically, the control circuit 280 provides the amplifier circuit 260 with a gain control signal 287. This allows for dynamically adjusting the gain factor of the amplifier circuit 260. The actual gain determines the signal level of the amplified transmit signal 261. According to the exemplary embodiment described here the amplified transmit signal 261 is fed into a communication cable and in particular in the UTP cable 192 shown in FIG. 1. FIG. 3 shows a flow chart of a method for transmitting PSD shaped signals into a communication cable, in particular into the UTP communication cable 192 depicted in FIG. 1.

The method starts with a step S1, wherein the signal generation circuit 210 generates the digital transmit signal 211, which comprises a sequence of transmit symbols. In the embodiment described here the signal generation circuit 210 is the above mentioned 1000BASE-T1 Ethernet PHY transceiver module. The digital transmit signal 211 is a PAM signal having a logical level of three with a frequency of 750 MHz.

In a following step S2 the digital transmit signal 211 is up-sampled by a factor of four towards a frequency of 3 GHz. The resulting (digital) signal is the up-sampled transmit signal 221. Also the up-sampled transmit signal 221 is a PAM signal having a logical level of three.

In a following step S3 the up-sampled transmit signal 221 is spectrally shaped by means of the digital FIR filter 230.

The filter coefficients of the FIR filter 230 are defined by the filter configuration signal 283 provided by the control circuit 280. The resulting signal is the filtered digital transmit signal 231.

In a following step S4 the switching unit 240 receives the filtered digital transmit signal 231 at a first input terminal 242. This step S4 is accomplished because the switching unit 240 (and the entire transmitter device 100) is/are in a first operational state wherein this first input terminal 242 is enabled. This is not the case in a second operational state of the switching unit 240 (and the entire transmitter device 100), in which another digital transmit signal 297 is received by the second input terminal 244 and is further processed by the switching unit 240. The described operational state is defined by the switching control signal 285 provided by the control circuit 280.

In a following step S5 the switching unit 240 outputs, when being in the first operational state and via the output terminal 246, the filtered digital transmit signal 231 as the selected digital signal 241. The In a following step S6 the selected digital signal 241 is converted by the DAC 250 into the analog transmit output signal 251.

In a following step S7 the analog transmit output signal 251 is amplified by the amplifier circuit 260. The resulting signal is denominated amplified analog signal 261. This is the final analog output signal of the transmitter device 100. The gain of the amplifier circuit 260 is defined by the gain control signal 287, which is also provided by the control circuit 280.

Figure 4:
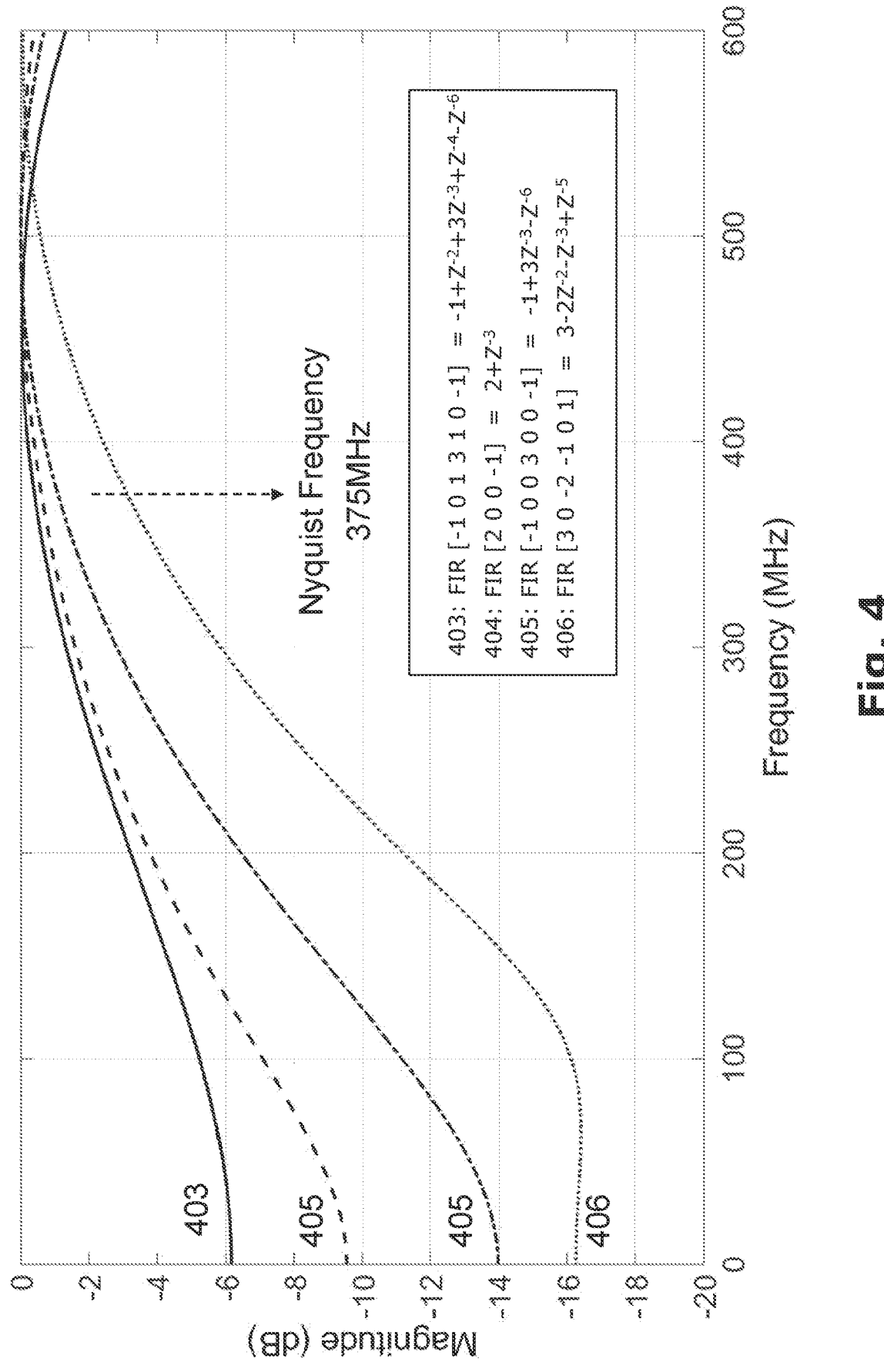
FIGS. 4 and 5 show various plot diagrams illustrating the PSD shaping of the transmitter device architecture of FIG. 2.

FIG. 4 shows a plot diagram showing the level of the PSD shaped amplified transmit signal 261 for different FIR filter coefficients. It is assumed that neither the switching unit 240, nor the DAC 250, nor the amplifier circuit 260 have a spectral dependency which would result in a further spectral dependent attenuation.

The FIR filter circuit 230 operates with the above mentioned up-sampled frequency of 3 MHz, which has been generated from the "original" 750 MHz PAM signal by an up-sampling factor of four. For comparison purposes, the Nyquist frequency of 375 MHz ($=\frac{1}{2} \times 750$ MHz) is also indicated in the plot diagram. All signal levels are normalized and are indicated as attenuation levels in −dB.

One can clearly see from FIG. 4 that the signal level below 200 MHz is strongly attenuated. This leads to a reduced electromagnetic pollution for such (small) frequencies.

It is mentioned that the shown curves 403, 404, 405, and 406 result from filter coefficients with a maximum number of seven (graphs 403 and 405). For more options up to 9 filter coefficients may be used. Further, each filter coefficient may also be represented by 4 bits.

Figure 5:
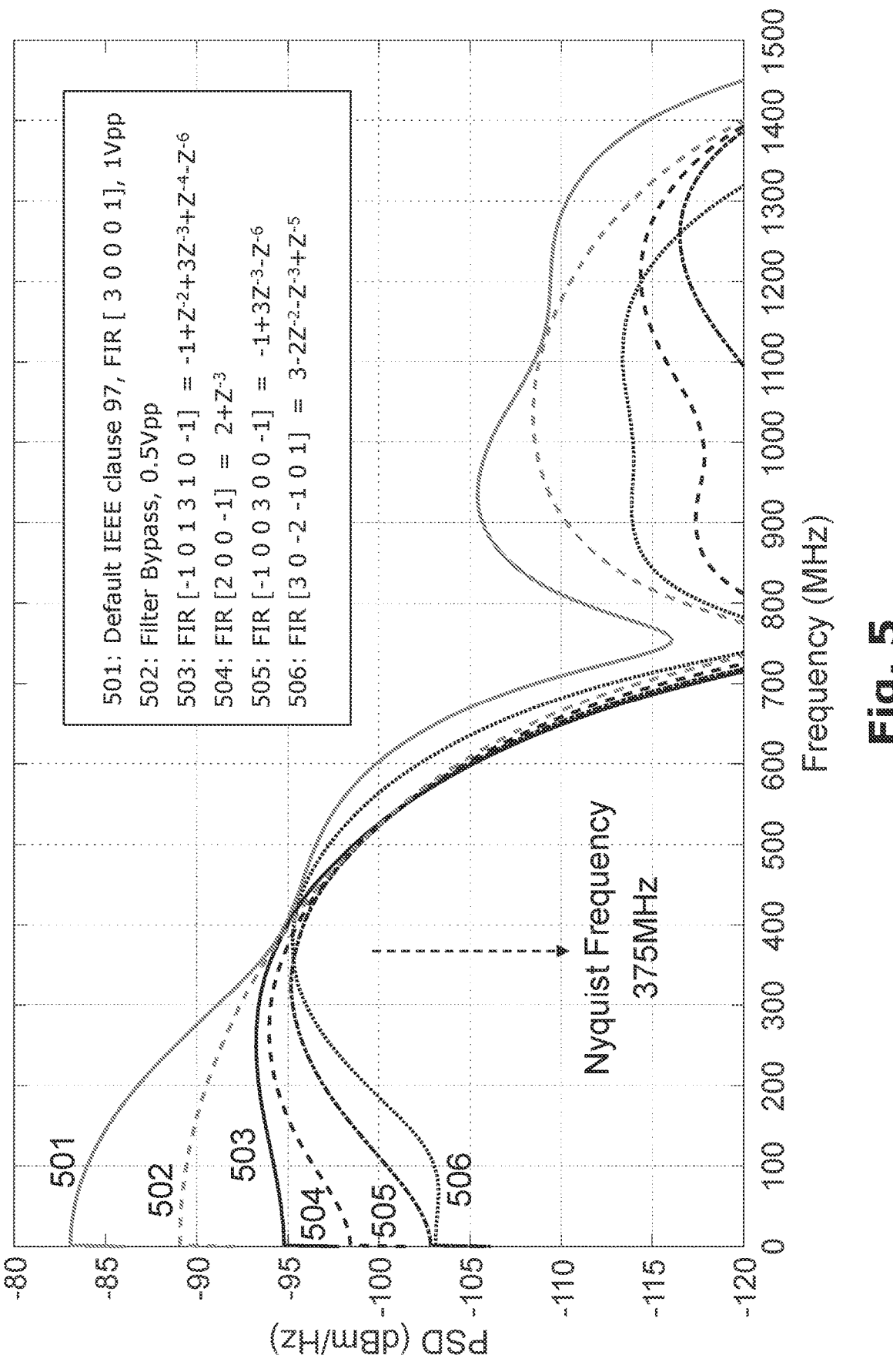

FIG. 5 shows a plot diagram illustrating the frequency dependent density level of the PSD shaped (amplified) output signal of the transmitter device 100. In the plot diagram the abscissa shows the frequency in MHz and the ordinate shows the density level in dBm/Hz.

Curve 501 shows the default curve as required by IEEE P802.3 clause 97. Curve 502 shows the respective curve when the filter circuit 230 is not activated. Curves 503, 504, 505, and 506 show the density level for the same filter coefficients as the corresponding attenuation curves depicted in FIG. 4. From these examples it can be seen that the electromagnetic emission is lower in frequency bands below 200 MHz and in particular below 170 MHz (corresponding to FM/DAB broadcasting) while the energy at and above the Nyquist frequency of 375 MHz, where the channel attenuation is typically the largest, is kept substantially unchanged. In other words, the described technology provides an additional reduction of spectrum in the FM/DAB band without losing much of energy in Nyquist band and above.

It is mentioned that the described technology of PSD shaping may also facilitate a pre-equalization. Hence, the transmit signal energy in higher frequency bands can be boosted where the typical channel insertion loss is typically high.

It should be noted that the term "comprising" does not exclude other elements or steps and the use of articles "a" or "an" does not exclude a plurality. Also elements described in association with different embodiments may be combined. It should also be noted that reference signs in the claims should not be construed as limiting the scope of the claims.

IST OF REFERENCE SIGNS 100 transmitter device
190 receiver device
192 communication cable/UTP cable
194 communication system
210 signal generation circuit
211 digital transmit signal/transmit symbols
220 up-sampling circuit
221 up-sampled transmit signal
230 filter circuit/FIR filter
231 filtered signal
240 switching unit
241 selected digital signal
242 first input terminal
244 second input terminal
246 output terminal
248 control terminal
250 digital to analog converter/DAC
251 analog transmit output signal
254 output terminal
260 amplifier circuit
261 amplified transmit signal
270 clock circuit
271 first clock signal
272 second clock signal
280 PHY layer control circuit
281 external control signal
283 filter configuration signal
285 switching control signal
287 gain control signal
296 external symbol source
297 another digital signal
S1-S7 Steps
403-406 frequency dependent attenuation curves
501-506 frequency dependent density level curves
The invention claimed is:

1. A transmitter device (100) for transmitting an analog signal (251, 261) via an electric cable (192), the transmitter device (100) comprising
    a signal generation circuit (210) for generating a digital transmit signal (211) comprising a sequence of transmit symbols;
    a filter circuit (230) for spectrally shaping the generated digital transmit signal (211, 221) and for outputting a filtered digital transmit signal (231);
    a switching unit (240) comprising a first input terminal (242) for receiving the filtered digital transmit signal (231), a second input terminal (244) for receiving another digital transmit signal (297), an output terminal (246) for outputting a digital transmit output signal (241), wherein the digital transmit output signal (241) is based on, depending on a switching state of the switching unit (240), the filtered digital transmit signal (231) or the another digital transmit signal (297), and a control circuit (280); and
    a control terminal (248) for receiving a control signal (285) from the control circuit (280), the control signal (285) being indicative for the switching state; and
    a digital to analog converter, DAC, (250) for receiving the digital transmit output signal (241) and for converting the received digital transmit output signal (241) to the analog signal (251, 261).

2. The transmitter device (100) of claim 1 wherein, by controlling the switching state, the control circuit (280) is configured to define at least two operational states of the transmitter device (100), wherein in a first operational state the functionality provided by the filter circuit (230) is utilized and in a second operational state the functionality of the filter circuit (230) is not utilized.

3. The transmitter device (100) of claim 1 wherein one of two operational states of the transmitter device (100) is a wakeup operational state or a linkup operational state.

4. The transmitter device (100) of claim 1, further comprising
    an up-sampling circuit (220) being connected between the signal generation circuit (210) and the filter circuit (230) for up-sampling the digital transmit signal (211) being generated by the signal generation circuit (210) to an up-sampled transmit signal (221) being received by the filter circuit (230) with a predefined up-sampling factor.

5. The transmitter device (100) of claim 1, further comprising
    a clock circuit (270)
    for timing the operation of the signal generation circuit (210) with a first clock signal (271) and
    for timing the operation of an up-sampling circuit (220) with a second clock signal (272),
    wherein a first clock rate of the first clock signal (271) is different from a second clock rate of the second clock signal (272).

6. The transmitter device (100) of claim 5, wherein the clock circuit (270) is electrically connected with at least one of
    (a) the filter circuit (230) for timing the operation of the filter circuit (230) with the second clock signal (272) and
    (b) the DAC (250) for timing the operation of the DAC (250) with the second clock signal (272).

7. The transmitter device (100) of claim 5, wherein the second clock rate is an integer multiple of the first clock rate and
    the integer multiple defines the up-sampling factor.

8. The transmitter device (100) of claim 1, wherein the filter circuit (230) comprises a Finite Impulse Response filter.

9. The transmitter device (100) of claim 1, wherein the control circuit (280) is connected with the filter circuit (230) and is configured for controlling a transfer function of the filter circuit (230).

10. The transmitter device (100) of claim 1, further comprising
    an amplifier circuit (260), which is connected with an output terminal (254) of the DAC (250) and which is configured for converting the analog signal (251) into an amplified analog signal (260).

11. The transmitter device (100) of claim 1, wherein the control circuit (280) is connected with an amplifier circuit (260) and is configured for controlling a gain factor of the amplifier circuit (260).

12. A communication system (194) comprising a transmitter device (100)

a receiver device (190); and a communication cable (192) communicatively coupling the transmitter device (100) with the receiver device (190); and wherein the transmitter device further comprising:

a signal generation circuit (210) for generating a digital transmit signal (211);

a filter circuit (230) for spectrally shaping the generated digital transmit signal (211, 221) and for outputting a filtered digital transmit signal (231);

a switching unit (240) comprising a first input terminal (242) for receiving the filtered digital transmit signal (231), a second input terminal (244) for receiving another digital transmit signal (297), an output terminal (246) for outputting a digital transmit output signal (241), wherein the digital transmit output signal (241) is one of the filtered digital transmit signal (231) or the another digital transmit signal (297) based on a switching state of the switching unit (240), and a control terminal (248) for receiving a control signal (285) from a control circuit (280), the control signal (285) being indicative of the switching state;

a digital to analog converter, DAC, (250) for receiving the digital transmit output signal (241) and for converting the received digital transmit output signal (241) to the analog signal (251, 261).

13. The communication system (194) of claim 12, wherein the communication cable (192) is an Unshielded Twisted Pair cable.

14. The communication system (194) of claim 12, wherein a spectral characteristic of the filter circuit is defined by a transfer function.

15. The communication system (194) of claim 14, wherein the transfer function depends on a parameter or coefficient setting of the filter circuit (230).

16. The communication system (194) of claim 14, wherein the control circuit (280) is connected with the filter circuit (230) and is configured for controlling the transfer function of the filter circuit (230).

17. A method comprising:

generating, by a signal generation circuit of a transmitter device, a digital transmit signal;

spectrally shaping, by a filter circuit of the transmitter device, the generated digital transmit signal to output a filtered digital transmit signal;

receiving, by a control terminal of the transmitter device, a control signal from a control circuit, the control signal being indicative of a switching state;

receiving, by a first input terminal of a switching unit of the transmitter device, the filtered digital transmit signal;

receiving, by a second input terminal of the switching unit of the transmitter device, a another digital transmit signal, outputting, by a switching unit of the transmitter device based at least on the switching state, to an output terminal a digital transmit output signal comprising one of the filtered digital transmit signal or the another digital transmit signal; and converting, by a digital to analog converter the transmitter device, the digital transmit output signal to an analog signal.

18. The method of claim 17, further comprising controlling, by the control circuit of the transmitter device, a transfer function of the filter circuit.

19. The method of claim 18, wherein a spectral characteristic of the spectral shaping of the filter is defined by the transfer function.

20. The method of claim 18, wherein the transfer function depends on a parameter or coefficient setting of the filter circuit.

* * * * *